(12) United States Patent
Wong et al.

(10) Patent No.: US 11,172,594 B2
(45) Date of Patent: Nov. 9, 2021

(54) HEAT DISSIPATION STRUCTURE

(71) Applicant: ASUSTEK COMPUTER INC., Taipei (TW)

(72) Inventors: Chun-Chieh Wong, Taipei (TW); Cheng-Yu Wang, Taipei (TW)

(73) Assignee: ASUSTEK COMPUTER INC., Taipei (TW)

( * ) Notice: Subject to any disclaimer, the term of this patent is extended or adjusted under 35 U.S.C. 154(b) by 0 days.

(21) Appl. No.: 16/792,947

(22) Filed: Feb. 18, 2020

(65) Prior Publication Data
US 2020/0288604 A1 Sep. 10, 2020

(30) Foreign Application Priority Data

Mar. 4, 2019 (TW) .................................. 108202567

(51) Int. Cl.
| | | |
|---|---|---|
| *H05K 7/20* | (2006.01) | |
| *H01L 23/42* | (2006.01) | |
| *G06F 1/20* | (2006.01) | |

(52) U.S. Cl.
CPC ......... *H05K 7/20454* (2013.01); *H01L 23/42* (2013.01); *H05K 7/20336* (2013.01); *G06F 1/20* (2013.01)

(58) Field of Classification Search
CPC ..... H01L 23/4006; H01L 23/42; H01L 24/32; H01L 23/10; G06F 1/20; G06F 1/203; H05K 7/20; H05K 7/20454; H05K 7/20336
See application file for complete search history.

(56) References Cited

U.S. PATENT DOCUMENTS

| | | | |
|---|---|---|---|
| 5,561,590 A | 10/1996 | Norell et al. | |
| 6,016,006 A * | 1/2000 | Kolman | H01L 21/54 257/712 |
| 7,961,469 B2 * | 6/2011 | Schmidt | H01L 24/32 361/705 |
| 10,076,063 B2 * | 9/2018 | Matsuda | G11B 33/1406 |
| 10,593,564 B2 * | 3/2020 | Iruvanti | H01L 21/4853 |
| 2003/0085475 A1 * | 5/2003 | Im | H01L 23/16 257/796 |
| 2004/0262766 A1 * | 12/2004 | Houle | H01L 23/04 257/758 |
| 2005/0061474 A1 * | 3/2005 | Gelorme | H01L 23/433 165/80.2 |
| 2006/0067054 A1 * | 3/2006 | Wang | H01L 23/42 361/704 |

(Continued)

FOREIGN PATENT DOCUMENTS

| | | |
|---|---|---|
| CN | 106413371 A | 2/2017 |
| CN | 106455427 A | 2/2017 |

*Primary Examiner* — Adam B Dravininkas
(74) *Attorney, Agent, or Firm* — Bacon & Thomas, PLLC

(57) ABSTRACT

A heat dissipation structure applied to a substrate with a heat generating element is provided. The heat dissipation structure includes a heat dissipation body and an elastomer. The heat dissipation body includes a connecting portion, where the connecting portion includes a central area and a peripheral area, and the central area is configured to contact with the heat generating element. The elastomer is disposed between the peripheral area and the heat generating element, to form a sealed space, and the sealed space is configured to accommodate a heat-conducting medium.

8 Claims, 5 Drawing Sheets

(56) References Cited

U.S. PATENT DOCUMENTS

| | | |
|---|---|---|
| 2007/0045819 A1 | 3/2007 | Edwards et al. |
| 2011/0042784 A1* | 2/2011 | Edwards ............... H01L 23/293 |
| | | 257/532 |
| 2014/0043769 A1* | 2/2014 | Chang ................ H05K 7/20509 |
| | | 361/720 |
| 2014/0085823 A1 | 3/2014 | Campbell et al. |
| 2016/0021781 A1 | 1/2016 | Jouanne et al. |
| 2016/0044824 A1* | 2/2016 | North ..................... B23P 15/26 |
| | | 361/679.47 |

* cited by examiner

HEAT DISSIPATION STRUCTURE

CROSS-REFERENCE TO RELATED APPLICATION

This application claims the priority benefit of Taiwan Application Serial No. 108202567, filed on Mar. 4, 2019. The entirety of the above-mentioned patent application is hereby incorporated by reference herein and made a part of specification.

BACKGROUND OF THE INVENTION

Field of the Invention

The disclosure relates to a heat dissipation structure.

Description of the Related Art

In recent years, with the development of science and technology, electronic products such as a desktop computer, a notebook computer, and a tablet computer have been widely used in daily life. An electronic device is equipped with a central processing unit (CPU), a graphics processing unit (GPU), or other electronic elements that generate heat during operation. A common heat dissipation manner is to apply thermal dissipation grease between a heat dissipation component and a heat generating element. The thermal grease fills up a gap between the heat dissipation component and the heat generating element, and conduct heat generated from the heat generating element to the heat dissipation component, to achieve heat dissipation.

As for existing liquid metal thermal grease, conventional thermal grease is doped with a metal material having a high thermal conductivity to further enhance a thermal conductivity of the conventional thermal grease. However, because of the properties of conductivity and fluidity, the liquid metal thermal grease may overflow during movement of an electronic product, resulting in the following disadvantage such as a short circuit or a burned part while using.

BRIEF SUMMARY OF THE INVENTION

The disclosure provides a heat dissipation structure applied to a substrate with a heat generating element. The heat dissipation structure includes a heat dissipation body and an elastomer. The heat dissipation body includes a connecting portion, where the connecting portion includes a central area and a peripheral area, and the central area is configured to contact with the heat generating element. The elastomer is disposed between the peripheral area and the heat generating element to form a sealed space, and the sealed space is configured to accommodate a heat-conducting medium.

In the heat dissipation structure of the disclosure, when the heat dissipation structure is disposed on the heat generating element, the elastomer is located between the heat dissipation body and the heat generating element and presses against the heat generating element, so that the heat dissipation body, the elastomer, and the heat generating element form the sealed space together. At this time, the heat-conducting medium coated on the heat generating element is squeezed by the central area of the heat dissipation body, so that a portion of the heat-conducting medium is suitable to overflow into the sealed space. In other words, the sealed space of the heat dissipation structure of the disclosure accommodates redundant heat-conducting medium, so that the heat-conducting medium does not overflow outside and does not cause a short circuit or a burned part.

DETAILED DESCRIPTION OF THE EMBODIMENTS

Figure 1:
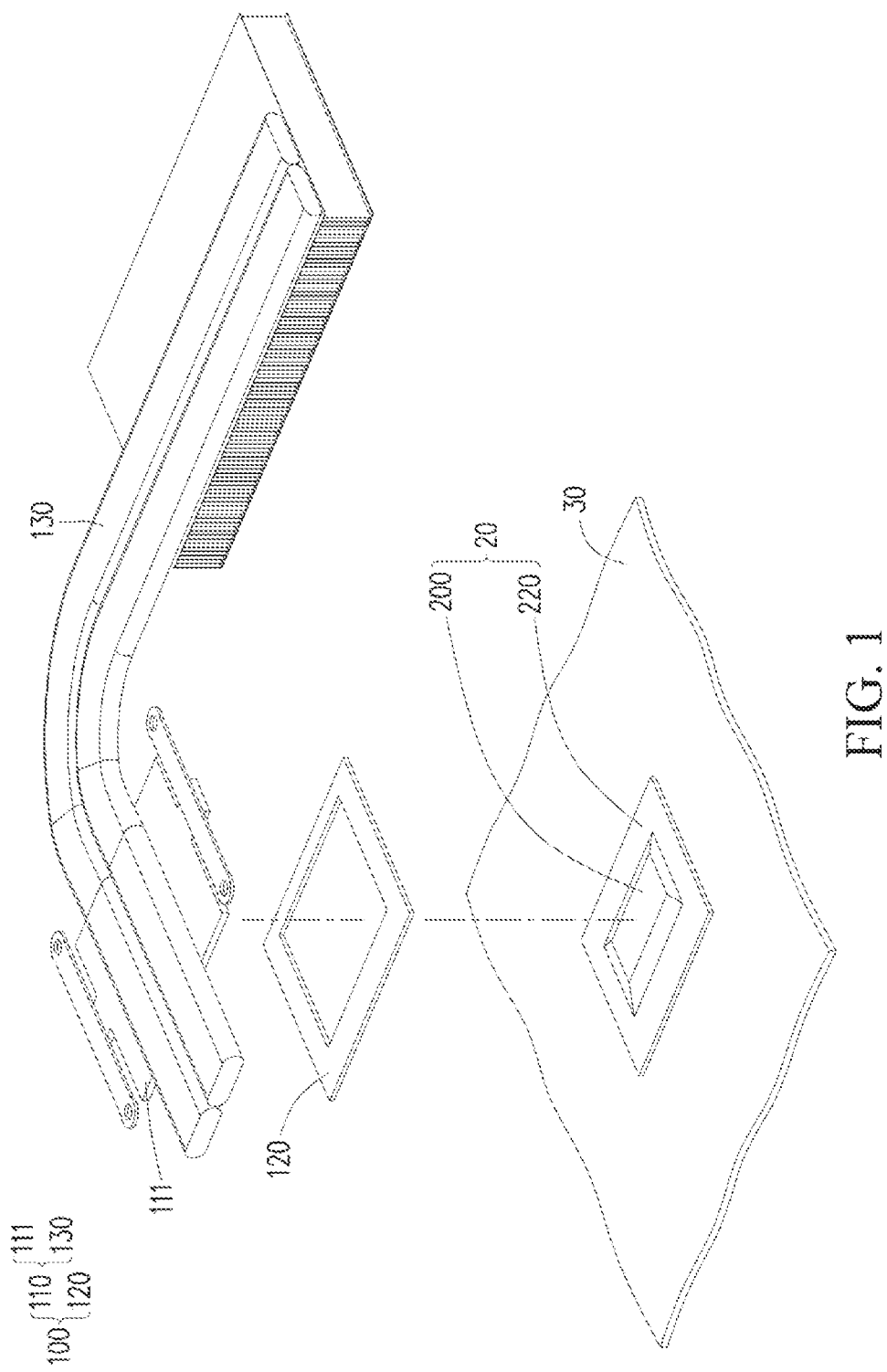
FIG. 1 is a schematic exploded view of application of a heat dissipation structure to a heat generating element according to a first embodiment of the disclosure.
Figure 2:
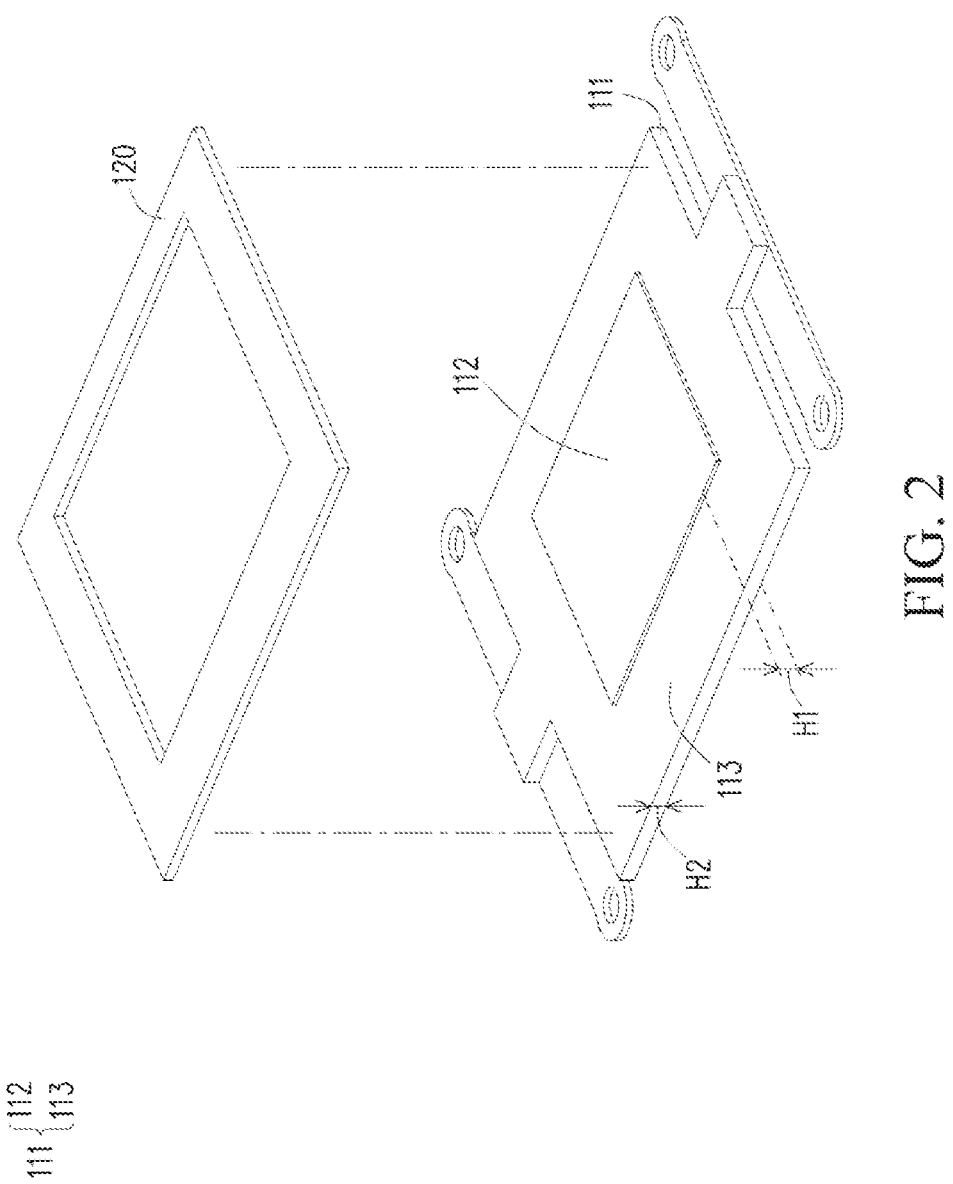
FIG. 2 is a schematic three-dimensional upward view of a heat dissipation body and an elastomer in FIG. 1.
Figure 3:
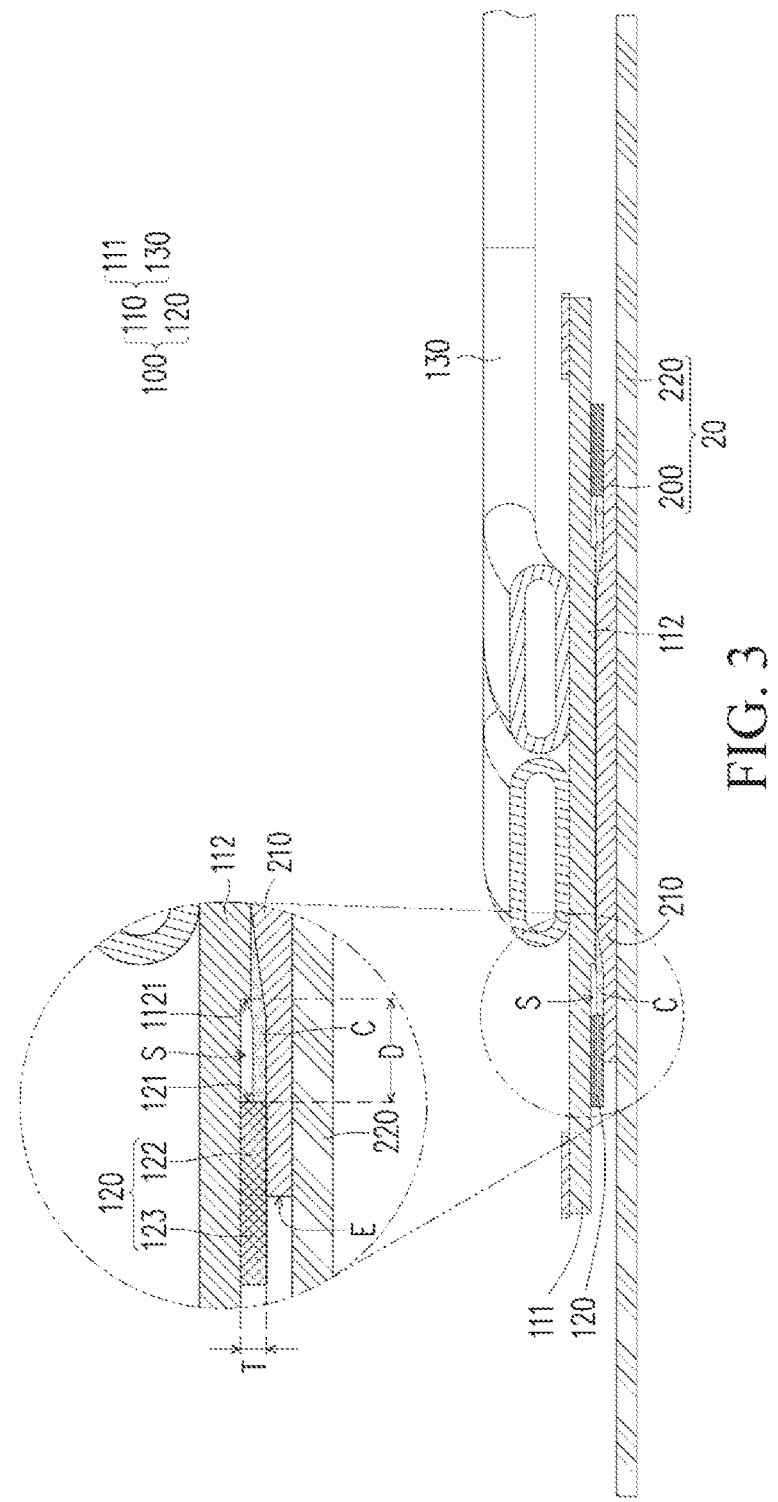
FIG. 3 is a schematic view of an enlarged local profile of FIG. 1.

FIG. 1 is a schematic exploded view of application of a heat dissipation structure to a heat generating element according to a first embodiment of the disclosure. FIG. 2 is a schematic three-dimensional upward view of a heat dissipation body and an elastomer in FIG. 1. FIG. 3 is a schematic view of an enlarged local profile of FIG. 1. Referring to FIG. 1, FIG. 2, and FIG. 3, a heat dissipation structure 100 of the disclosure includes a heat dissipation body 110 and an elastomer 120. The heat dissipation structure 100 is disposed on a heat generating element 200.

In this embodiment, the heat generating element 200 is disposed on a substrate 220, and the heat generating element 200 and the substrate 220 are combined and taken as a functional module 20. In this embodiment, the functional module 20 is, for example, a central processing unit (CPU) is disposed on a main board 30. However, in other embodiments, the functional module 20 is also a graphics processing unit (GPU) or other electronic elements, and is not limited herein.

Referring to FIG. 2, the heat dissipation body 110 includes a connecting portion 111, and the connecting portion 111 includes a central area 112 and a peripheral area 113. The peripheral area 113 surrounds the central area 112 and a thickness H1 of the central area 112 is greater than a thickness H2 of the peripheral area 113. In this embodiment, the elastomer 120 is disposed annularly in the peripheral area 113 of the connecting portion 111 of the heat dissipation body 110, but in other embodiments, the elastomer is not limited thereto.

Referring to FIG. 3, a heat-conducting medium C is coated between the heat generating element 200 and the heat dissipation structure 100. When the heat dissipation structure 100 is disposed on the heat generating element 200, the elastomer 120 is located between the connecting portion 111 and the heat generating element 200 and presses against the heat generating element 200, so that the connecting portion 111, the elastomer 120, and the heat generating element 200 form a sealed space S together.

In this embodiment, the heat-conducting medium C is, for example, liquid metal thermal grease, but in other embodiments, the heat-conducting medium is not limited thereto. In this embodiment, the elastomer 120 is, for example, foam (such as high-density foam), but in other embodiments, the elastomer 120 is also rubber, silica gel, or other materials that are compressed and prevents the heat-conducting medium C from overflowing, and the elastomer is not limited to the above.

As such, when the heat dissipation structure 100 is disposed on the heat generating element 200, the central area 112 of the connecting portion 111 squeezes the heat-conducting medium C coated on the heat generating element 200. At this time, a portion of the heat-conducting medium C overflows into the sealed space S. Therefore, a short circuit or a burned part caused by an overflow of the heat-conducting medium C to a circuit structure is avoid.

In an embodiment, the elastomer 120 is made of a compressible material. Therefore, when the elastomer 120 is located between the connecting portion 111 and the heat generating element 200 and presses against the heat generating element 200, the elastomer 120 is in close contact with the connecting portion 111 and the heat generating element 200, so that the sealed space S formed by the connecting portion 111, the elastomer 120, and the heat generating element 200 prevents the heat-conducting medium C from overflowing effectively.

In an embodiment, the central area 112 of the connecting portion 111 protrudes from the peripheral area 113. The heat generating element 200 includes a protrusion 210 facing the central area 112, and when the connecting portion 111 is disposed on the heat generating element 200, the central area 112 is corresponding to the protrusion 210. In this embodiment, the connecting portion 111 includes the protruded central area 112 raises a distance between the peripheral area 113 of the connecting portion 111 and an edge of the heat generating element 200, and the distance is greater than or equal to 1 millimeter (for example, 1 millimeter to 1.5 millimeters). The disclosure is not limited thereto.

In an embodiment, a thickness T of the elastomer 120 is 1 millimeter, but in other embodiments, the thickness T of the elastomer 120 is between 0.5 millimeter and 1.5 millimeters. The elastomer 120 includes a first side wall 121 facing the central area 112, and the central area 112 includes a second side wall 1121 opposite to the first side wall 121. A distance D between the first side wall 121 of the elastomer 120 and the second side wall 1121 of the central area 112 is between 1 millimeter and 3 millimeters, so that the sealed space S formed by the connecting portion 111, the elastomer 120, and the heat generating element 200 is sufficient to accommodate the heat-conducting medium C.

In this embodiment, the heat dissipation body 110 further includes a heat pipe 130. In FIG. 1 to FIG. 3, only a part of the heat pipe 130 is depicted. Heat energy of the heat dissipation body 110 is thermally coupled to a fin or other places via the heat pipe 130. Definitely, in other embodiments, the heat dissipation body 110 does not include the heat pipe 130, and a form of the heat dissipation body 110 is not limited thereto.

Other embodiments are listed below for description. It needs to be noted herein that in the following embodiments, reference numerals and a portion of the foregoing embodiments are used, and same reference numerals are used to represent same or similar elements, and descriptions about same technical contents are omitted. For the omitted descriptions, reference is made to the foregoing embodiments, and details are not repeated again in the following embodiments.

Figure 4:
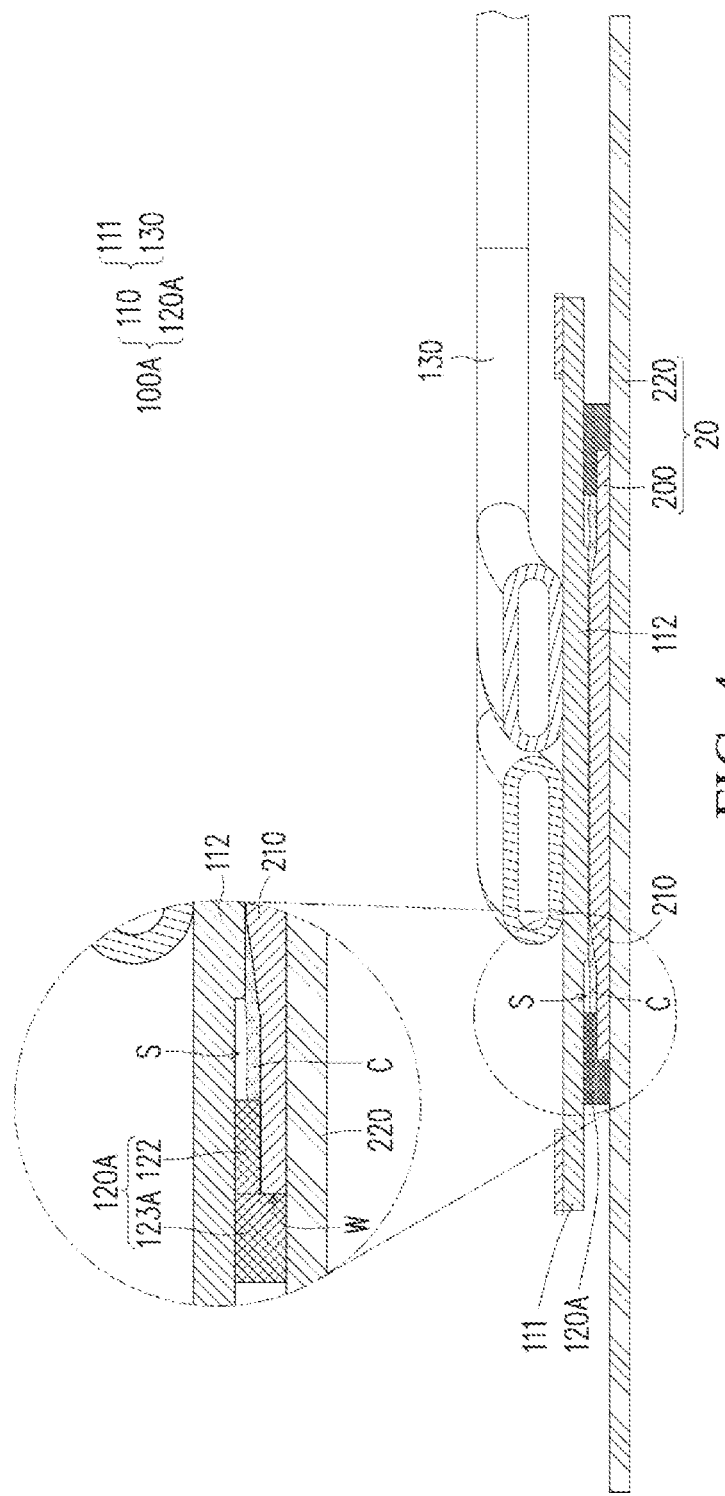
FIG. 4 to FIG. 6 are schematic views of enlarged local profiles of application of a heat dissipation structure to a heat generating element according to a plurality of embodiments of the disclosure.
Figure 5:
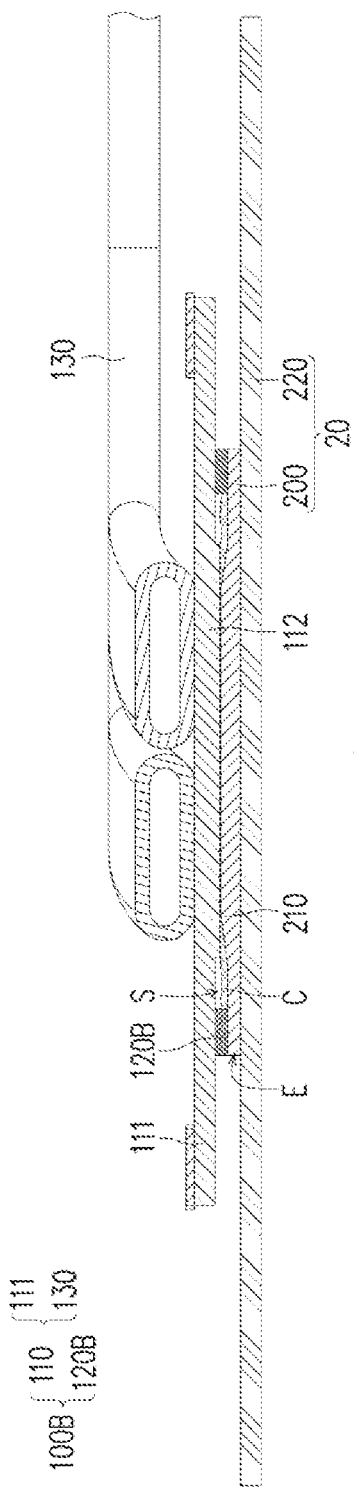
Figure 6:
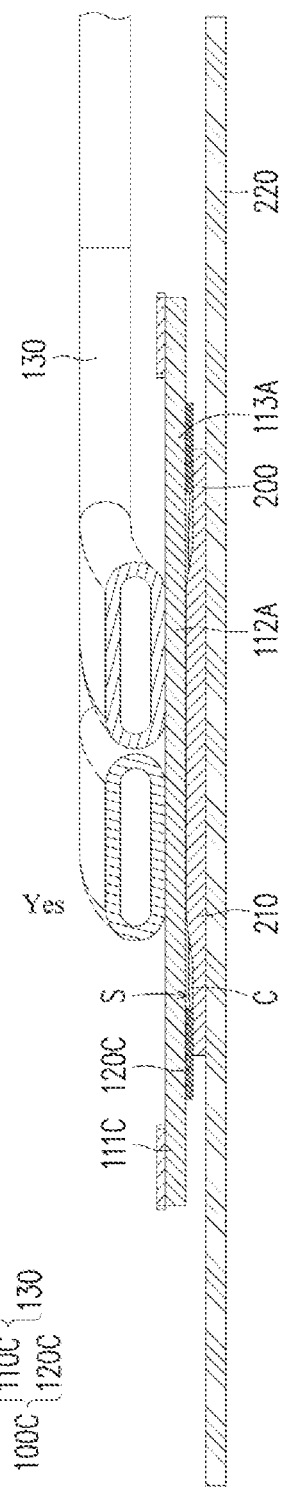

FIG. 4 to FIG. 6 are schematic views of enlarged local profiles of application of a heat dissipation structure to a heat generating element according to a plurality of embodiments of the disclosure. Referring first to FIG. 4, the heat generating element 200 is disposed on the substrate 220. An elastomer 120A of a heat dissipation structure 100A in this embodiment is slightly different from the elastomer 120 of the heat dissipation structure 100 in FIG. 3. The elastomer 120 in FIG. 3 includes the first portion 122 contacting with the heat generating element 200 and the second portion 123 extending beyond the edge E of the heat generating element 200.

The second portion 123 is suspended over the substrate 220. In this embodiment, a second portion 123A of the elastomer 120A extends along an outer surface W of the heat generating element 200 to the substrate 220. That is, the second portion 123A is closely attached to the outer surface W and the substrate 220. An advantage of this method is that a sealing area and a sealing effect are further enhanced, thereby preventing the heat-conducting medium C from overflowing from the sealed space S more effectively.

Next, referring to FIG. 5, an elastomer 120B of a heat dissipation structure 100E in this embodiment is slightly different from the elastomer 120 of the heat dissipation structure 100 in FIG. 3. The elastomer 120B in FIG. 3 does not include the second portion 123 extending beyond the edge E of the heat generating element 200 in FIG. 3. In this embodiment, the elastomer 120B is aligned with the edge E of the heat generating element 200, but in other embodiments, the elastomer 120B extends to the edge E of the heat generating element 200.

Referring to FIG. 6, a heat dissipation body 110C of a heat dissipation structure 100C in this embodiment is slightly different from the heat dissipation body 110 of the heat dissipation structure 100 in FIG. 3. In this embodiment in FIG. 3, a central area 112A and a peripheral area 113A of a connecting portion 111C are equal in height, and a thickness of an elastomer 120C is less than that of the elastomer 120. However, the disclosure is not limited thereto, and the central area 112A of the connecting portion 111C does not protrude from the peripheral area. 113A. The central area 112A is actually flush with the peripheral area 113A. Definitely, in this embodiment, the central area 112A and the peripheral area 113A are planar, but in other embodiments, the central area 112A and the peripheral area 113A may also be non-planar, which is not limited herein.

In summary, in the heat dissipation structure of the disclosure, the heat dissipation body includes a central area and a peripheral area located on the connecting portion. The elastomer is disposed annularly in the peripheral area of the connecting portion of the heat dissipation body. When the heat dissipation structure is disposed on the heat generating element, the elastomer is located between the heat dissipation body and the heat generating element and presses against the heat generating element, so that the heat dissipation body, the elastomer, and the heat generating element form a sealed space together. At this time, the heat-conducting medium coated on the heat generating element is squeezed by the central area of the heat dissipation body, so that a portion of the heat-conducting medium is suitable to overflow into the sealed space. In other words, the sealed space of the heat dissipation structure of the disclosure accommodates the heat-conducting medium, so that the heat-conducting medium does not overflow outside, thereby cause a short circuit or a burned part.

Although the disclosure is described with reference to the above embodiments, the embodiments are not intended to limit the disclosure. A person of ordinary skill in the art may make variations and modifications without departing from the spirit and scope of the disclosure. Therefore, the protection scope of the disclosure should be subject to the appended claims.

What is claimed is:

1. A heat dissipation structure, applied to a substrate with a heat generating element, comprising:

a heat dissipation body, having a connecting portion, wherein the connecting portion comprises a central area and a peripheral area, and the central area is configured to contact with the heat generating element; and an elastomer, disposed between the peripheral area and the heat generating element, to form a sealed space, wherein the sealed space is configured to accommodate a heat-conducting medium;

wherein the central area squeezes the heat-conducting medium coated on the heat generating element, and a portion of the heat-conducting medium overflows into the sealed space;

wherein, in a normal direction of the heat dissipation structure, the sealed space is located between the heat generating element and the peripheral area, and the sealed space is connected to the heat generating element and the peripheral area, wherein the normal direction is defined as a direction parallel to a thickness of the elastomer.

2. The heat dissipation structure according to claim 1, wherein the heat generating element comprises a protrusion, and the central area is corresponding to the protrusion.

3. The heat dissipation structure according to claim 1, wherein a thickness of the central area is greater than a thickness of the peripheral area.

4. The heat dissipation structure according to claim 1, wherein a thickness of the central area is equal to a thickness of the peripheral area.

5. The heat dissipation structure according to claim 1, wherein the elastomer comprises a first portion contacting with the heat generating element and a second portion extending beyond an edge of the heat generating element.

6. The heat dissipation structure according to claim 5, wherein the second portion extends along an outer surface of the heat generating element to the substrate.

7. The heat dissipation structure according to claim 1, wherein the heat dissipation body further comprises a heat pipe.

8. The heat dissipation structure according to claim 1, wherein the elastomer comprises foam, rubber, silica gel or a combination thereof.

* * * * *